US00RE47018E

(19) United States
(12) Reissued Patent
Seo

(10) Patent Number: US RE47,018 E
(45) Date of Reissued Patent: Aug. 28, 2018

(54) TRANSPARENT DISPLAY APPARATUS

(71) Applicant: Samsung Electronics Co., Ltd., Gyeonggi-do (KR)

(72) Inventor: Ho-Seong Seo, Suwon-Si (KR)

(73) Assignee: Samsung Electronics Co., Ltd (KR)

(21) Appl. No.: 14/335,013

(22) Filed: Jul. 18, 2014

Related U.S. Patent Documents

Reissue of:
(64) Patent No.: 8,227,797
Issued: Jul. 24, 2012
Appl. No.: 12/493,882
Filed: Jun. 29, 2009

(30) Foreign Application Priority Data

Jun. 27, 2008 (KR) ..... 10-2008-0061638

(51) Int. Cl.
*H01L 29/08* (2006.01)
*H01L 27/32* (2006.01)

(52) U.S. Cl.
CPC ..... *H01L 27/3232* (2013.01); *H01L 27/3267* (2013.01); *H01L 27/3239* (2013.01); *H01L 27/3241* (2013.01); *H01L 2251/5323* (2013.01)

(58) Field of Classification Search
CPC .... G06F 3/1423; G06F 3/1431; G06F 3/1446; G09G 2300/026; G02F 1/13336;
(Continued)

(56) References Cited

U.S. PATENT DOCUMENTS 6,600,527 B1 * 7/2003 Basturk ..... G02F 1/133536 349/115
6,875,320 B2 * 4/2005 Raychaudhuri et al. ..... 204/192.12
(Continued)

FOREIGN PATENT DOCUMENTS

KR 1020040111048 12/2004
KR 1020050043174 5/2005
KR 1020070035858 4/2007

OTHER PUBLICATIONS

Korean Office Action dated Feb. 23, 2015 issued in counterpart application No. 10-2008-0061638.

*Primary Examiner* — Henry Tran
(74) *Attorney, Agent, or Firm* — The Farrell Law Firm, P.C.

(57) ABSTRACT

A transparent display apparatus is provided that is constructed to transmit or block a light of images selectively according to a supply of electric power to a conventional transparent organic light emitting diode. The transparent display apparatus includes a transparent organic light emitting diode having a glass substrate, a transparent anode, a hole transport layer, an emitting layer, an electron transport layer and a transparent cathode. The transparent display apparatus includes an insulating layer stacked on the transparent cathode, and first and second transparent ITOs stacked on the insulating layer to deliver electromotive force onto an entire surface and to transmit or block the light of images according to the on/off state of a power source. The transparent display apparatus also includes an electro chromic layer provided between the first and the second transparent ITOs and including transparent and colorless chemicals. The electro chromic layer forms a color through oxidation-reduction reaction of the chemicals according to the on/off state of the power source to absorb or block the light of images. The transparent display apparatus further includes a substrate stacked on the second transparent ITO.

7 Claims, 4 Drawing Sheets

(58) Field of Classification Search
CPC . H01L 51/0545; H01L 51/0036; H01L 33/20; H01L 33/30; H01L 33/32; H01L 33/60; H01L 33/62; H01L 51/5012; H01L 51/0081; H01L 27/3244; B82Y 10/00; B82Y 20/10
USPC ..... 345/5, 903, 9; 257/40, 96, 98, E51.022; 40/336, 661, 534
See application file for complete search history.

(56) References Cited

U.S. PATENT DOCUMENTS

| | | | | |
|---|---|---|---|---|
| 2004/0253756 | A1 | 12/2004 | Cok et al. | |
| 2007/0131949 | A1* | 6/2007 | Liu | 257/89 |
| 2008/0252202 | A1* | 10/2008 | Li et al. | 313/504 |

* cited by examiner

TRANSPARENT DISPLAY APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY

This application claims priority under 35 U.S.C. §119(a) to an application entitled "Transparent Display Apparatus" filed in the Korean Intellectual Property Office on Jun. 27, 2008 and assigned Serial No. 10-2008-0061638, the contents of which are incorporated herein by reference.

BACKGROUND OF THE INVENTION

1. Field of the Invention

The present invention relates generally to a transparent display apparatus, and more particularly, to a transparent display apparatus constructed for selectively transmitting or blocking light of an image according to a supply of electric power to a conventional transparent organic light emitting diode.

2. Description of the Related Art

In general, an organic light emitting display device has a stack structure of an Organic Light Emitting Diode (OLED) and a Thin Film Transistor TFT layer. The OLED that emits light is stacked on the TFT layer forming an electric circuit, so that an emitting layer of the OLED can selectively emit light based on a signal controlled through the TFT layer.

The organic light emitting display device can be divided into an OLED display apparatus on a non-transparent substrate and a transparent OLED display apparatus on a transparent substrate. The structure of the transparent OLED display apparatus is described below.

The display apparatus includes a TFT layer (not shown) having a substrate, a gate electrode, a source region, a drain region, a via hole, etc.

As shown in FIGS. 1 and 2, the Transparent Organic Light Emitting Diode (TOLED) 1 includes a transparent anode 3, a hole transport layer 4, an emitting layer 5, an electron transport layer 6, and a transparent cathode 7, which are sequentially stacked on a glass substrate 2 of the TFT layer.

When a voltage is applied to the gate electrode, a channel in an organic semiconductor region is opened and a current flows from the source region to the drain region, which then passes through the transparent anode 3, the hole transport layer 4, the emitting layer 5, the electron transport layer 6, and the transparent cathode 7 of the TOLED 1 through the via hole. A light emitting function (that is, a function resulting from the application of an electric current) occurs in the emitting layer 5, when holes and electrons are combined and excited and the resulting energy is thus emitted in the form of light. This light refers to, for example, an emitting point corresponding to one pixel of a display panel.

As shown in FIGS. 1 and 2, the light emitting type can be divided into a downward emitting type in which light is emitted in a substrate direction, and an upward emitting type in which light is emitted in the opposite direction with respect to a light-emitting direction. Current trends favor the upward emitting type, in which the light can be emitted over a relatively wider region. The light in the upward emitting type can be projected out of a wide region through a black-matrix (not shown). The light in the downward emitting type can be projected out of only a region corresponding to the gate electrode. The cathode should be naturally transparent so that the light can travel in the upper direction. To this end, the conventional cathode was made to have a structure where indium-tin oxide (ITO) and silver (Ag) are stacked one by one.

A metal such as silver (Ag) is thinly laid and a transparent ITO is stacked on the metal in a desirable thickness. Thus, the conductivity characteristic of the metal and the light transmittance characteristic of ITO are combined. Here, the silver (Ag) is defined to have a thickness of about 5 nm, and the ITO is defined to have a thickness of about 50 to 200 nm.

Characteristics of the cathode should include good light transmission and the maintaining of a certain level of conductivity to prevent an unduly power consumption. Therefore, the cathode includes the ITO and the silver (that is, a metal) stacked on each other, which have the two above-mentioned characteristics.

The conventional TOLED may show its back side simultaneously, and such a characteristic may be considered as an advantage of the conventional TOLED. However, such a characteristic may sometimes decrease visibility or serve as a disturbance because the background can be seen.

When the conventional TOLED is applied to a watch-type mobile terminal, the watch-type mobile terminal always needs to display the time for a phone mode even when not in a communication state. However, when a display for the phone mode is adorned like that of a watch, it is necessary to keep turning on the display screen, which increases the power consumption of the mobile terminal. Moreover, it is impossible to adorn the watch-type mobile terminal with jewels as for an ordinary watch.

SUMMARY OF THE INVENTION

The present invention has been made to address at least the above problems and/or disadvantages and to provide at least the advantages described below. Accordingly, an aspect of the present invention provides a transparent display apparatus having a construction for selectively transmitting or blocking light of an image according to the supply of electric power to a conventional TOLED, so that a background screen can be selectively transmitted or blocked according to the use of a product.

Another aspect of the present invention provides a transparent display apparatus having a construction for selectively transmitting or blocking light of an image according to the supply of electric power to a conventional TOLED, so that an overlaid display of a product can be manufactured and the display of a front/back side is possible according to the supply of electric power, thereby allowing a user to recognize the front side display of the conventional TOLED and improving the use of a product.

An additional aspect of the present invention provides a transparent display apparatus for reducing power consumption by adjusting transmission/non-transmission and the degree of the transmission according to the intensity of the supply of electric power, and saving manufacturing cost since a patterning process of a pixel unit is unnecessary.

A further aspect of the present invention provides a transparent display apparatus that includes a transmissive-type Liquid Crystal Display (LCD) for transmitting or blocking the light of images selectively according to the supply of electric power to a conventional TOLED, so that transmittance can be adjusted and manufacturing cost also can be saved because its panel form does not require a patterning process of a pixel unit, thereby curtailing the time of the assembly process.

An aspect of the present invention also provides a transparent display apparatus and a transmissive-type LCD applied to a watch-type phone, which selectively transmit or block the light of an image according to the supply of electric power to a conventional TOLED, thereby reducing the power consumption of a product because a watch display is possible even when there is no supply of electric power, and allowing the use of images of a watch.

According to one aspect of the present invention, a transparent display apparatus is provided having a TOLED. The TOLED includes a glass substrate, a transparent anode, a hole transport layer, an emitting layer, an electron transport layer, and a transparent cathode. The transparent display apparatus includes an insulating layer stacked on the transparent cathode, and first and second transparent ITOs stacked on the insulating layer to deliver electromotive force onto the entire surface of the apparatus and to transmit or block the light of images according to the on/off state of a power source. The transparent display apparatus also includes an electro chromic layer provided between the first and the second transparent ITOs, which includes transparent and colorless chemicals. The electro chromic layer forms a color through oxidation-reduction reaction of the chemicals according to the on/off state of a power source to absorb or block the light of images. The transparent display apparatus further includes a substrate stacked on the second transparent ITO.

According to another aspect of the present invention, a transparent display apparatus is provided having a TOLED. The TOLED includes a glass substrate, a transparent anode, a hole transport layer, an emitting layer, an electron transport layer, and a transparent cathode. The transparent display apparatus includes an insulating layer stacked on the transparent cathode, and first and second transparent ITOs stacked on the insulating layer to deliver electromotive force onto the entire surface of the apparatus and to transmit or block the light of images according to the on/off state of a power source. The transparent display apparatus also includes first and second polarizers provided between the first and the second transparent ITOs, and a transmissive-type LCD provided between the first and the second polarizers to transmit or block the light of images according to the on/off state of the power source.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF THE PREFERRED EMBODIMENT

Figure 1:
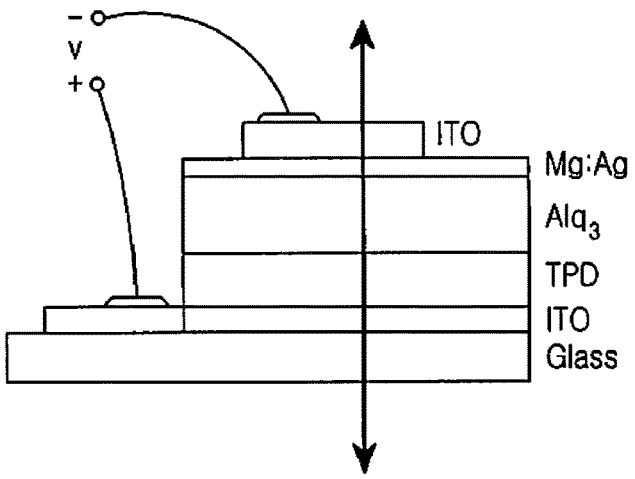
FIG. 1 is a diagram illustrating a cross section of the conventional transparent display apparatus.
Figure 2:
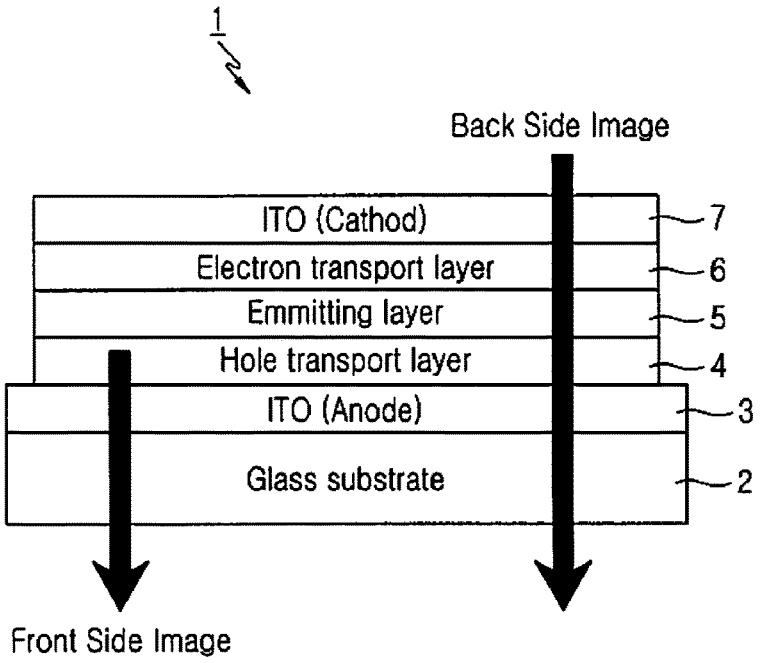
FIG. 2 is a diagram illustrating a cross section and the operation state of the conventional transparent display apparatus.

Preferred embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

It is to be understood that the structure recited and shown in the present specification and the drawings is presented as one example for the best mode for operating the present invention and does not represent all of the principles of the present invention, so various modifications thereof can be made on the application date of the present invention.

Figure 3:
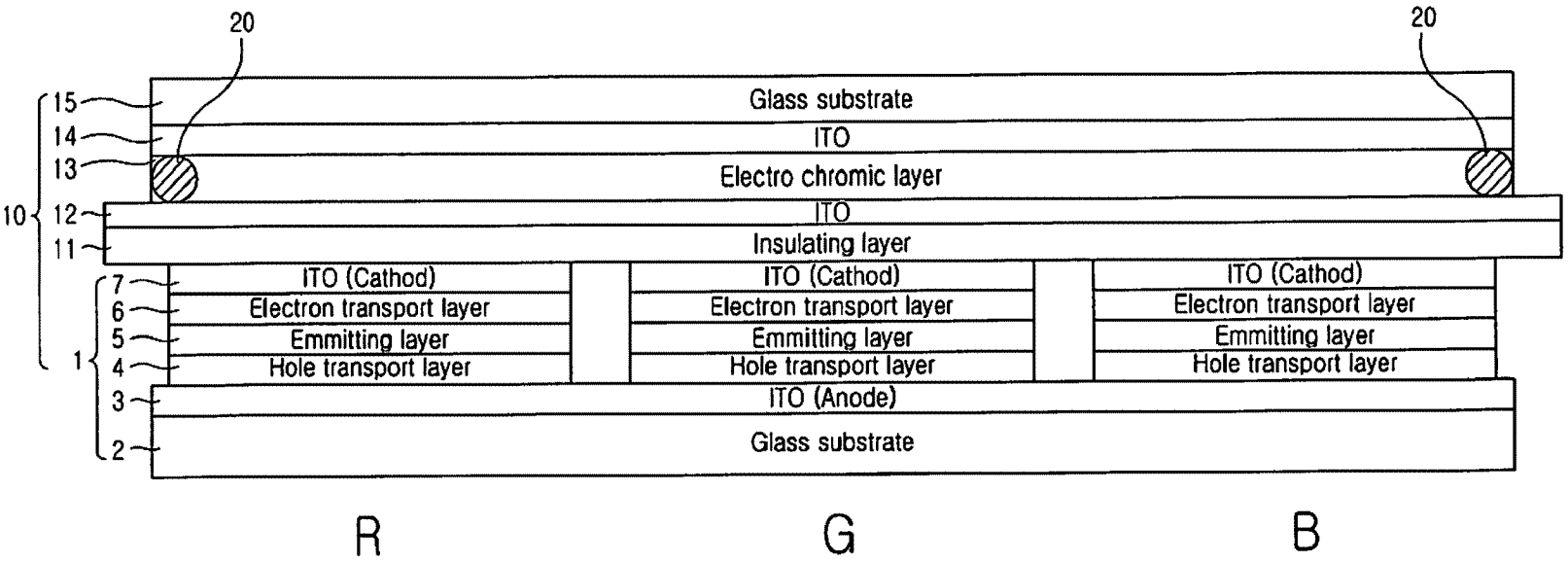
FIG. 3 is a diagram illustrating a cross section of a transparent display apparatus according to an embodiment of the present invention.

As shown in FIG. 3, a transparent display apparatus 10 includes a TOLED 1 having a glass substrate 2, a transparent anode 3, a hole transport layer 4, an emitting layer 5, an electron transport layer 6 and a transparent cathode 7, an insulating layer 11, first and second transparent ITOs 12 and 14, an electro chromic layer 13, and a glass substrate 15.

As shown in FIG. 3, the insulating layer 11 is stacked on the transparent cathode 7 to maintain electrical insulation between an electrode of the electro chromic layer 13 and an electrode of the TOLED 1. The first and second transparent ITOs 12 and 14 are stacked on the insulating layer 11 to deliver electromotive force onto the entire surface and to transmit or block the light of images in particular according to the on/off state of a power source. Further, the electro chromic layer 13 includes transparent and colorless chemicals in a gel state, and is provided between the first and the second transparent ITOs 12 and 14, so as to form a color through oxidation-reduction reaction of the chemicals according to the on/off state of a power source, thereby absorbing or blocking the light of an image. The glass substrate 15 is stacked on the second transparent ITO 14 to protect the first and second transparent ITOs 12 and 14 and the electro chromic layer 13.

As shown in FIG. 3, the electro chromic layer 13 includes a sealing apparatus 20 for sealing the gel.

Figure 5:
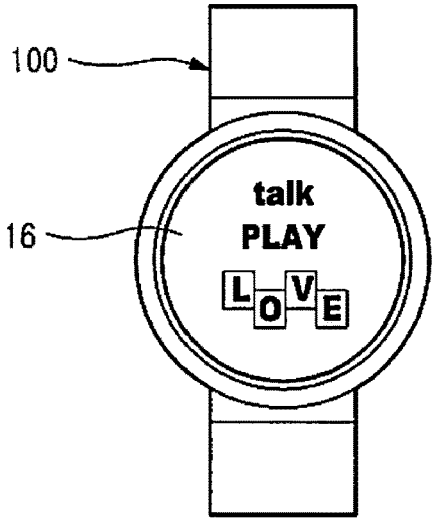
FIG. 5 is a diagram illustrating a state of displaying a front side first screen of the operation states of a transparent display apparatus according to an embodiment of the present invention.
Figure 6:
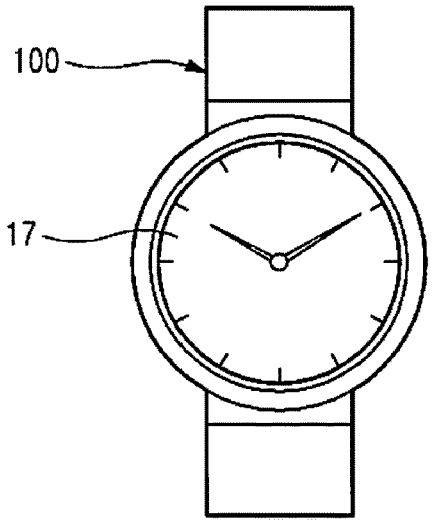
FIG. 6 is a diagram illustrating a state of displaying a back side second screen of the operation states of a transparent display apparatus according to an embodiment of the present invention.

As shown in FIGS. 3, 5 and 6, when a power source (0.4 to 1.6 V dc) is ON, the electro chromic layer 13 forms a black color by oxidation-reduction reaction of two kinds of chemicals, so as to block the light of background images and simultaneously display a front side first screen 16. When the power source is OFF, it forms a transparent color, thereby absorbing and transmitting the light of background images and displaying therefore a back side second screen 17.

The electro chromic layer 13 can adjust transmittance by the intensity of the power source.

The structure of a transparent display apparatus according to the first embodiment of the present invention has been described. The operation process of the transparent display apparatus is described in detail below with reference to the accompanying FIGS. 3, 5 and 6.

A transparent display apparatus 10 having the above structure is applied to the watch-type mobile terminal 100.

According to an embodiment of the present invention, the transparent display apparatus 10 is applicable to other electronic devices and all portable communication devices as well as the transparent display apparatus 10.

As shown in FIG. 5, if the transparent display apparatus 10 is supplied with electric power, a voltage of the electro chromic layer 13 turns ON (for example, 0.4 to 1.6 V dc). At the same time, the electro chromic layer 13 forms a black color by oxidation-reduction reaction of two kinds of chemicals, thereby blocking the light of watch background images of the watch-type mobile terminal 100.

A phone-mode image of the watch-type mobile terminal 100 is then displayed.

Herein, a user can make a phone call through the phone-mode image of the watch-type mobile terminal 100.

The watch-type mobile terminal 100 has a phone-mode background as a front side first screen 16, and also has a watch background as a back side second screen 17.

As such, the watch-type mobile terminal 100 operates a display of a front side first screen when it is in the phone-mode, and does not show the watch background of the back side second screen 17.

As shown in FIG. 6, if the transparent display apparatus 10 is not supplied with electric power, a voltage of the electro chromic layer 13 turns OFF. At the same time, the electro chromic layer 13 and the first and second transparent ITOs 12 and 14 form a transparent color, thereby absorbing and transmitting the light of watch background images of the watch-type mobile terminal 100.

The front side first screen 16 of the watch-type mobile terminal 100 becomes transparent and the watch background of the back side second screen 17 can be shown.

As such, the back side watch background of the watch-type mobile terminal 100 can be displayed without the supply of electric power so that power consumption of the mobile terminal is reduced and jewel adornment of the screen is practicable, therefore luxury images can be presented.

The operation process of a transparent display apparatus according to another embodiment of the present invention will be described in detail with reference to the accompanying FIGS. 4, 5 and 6.

Figure 4:
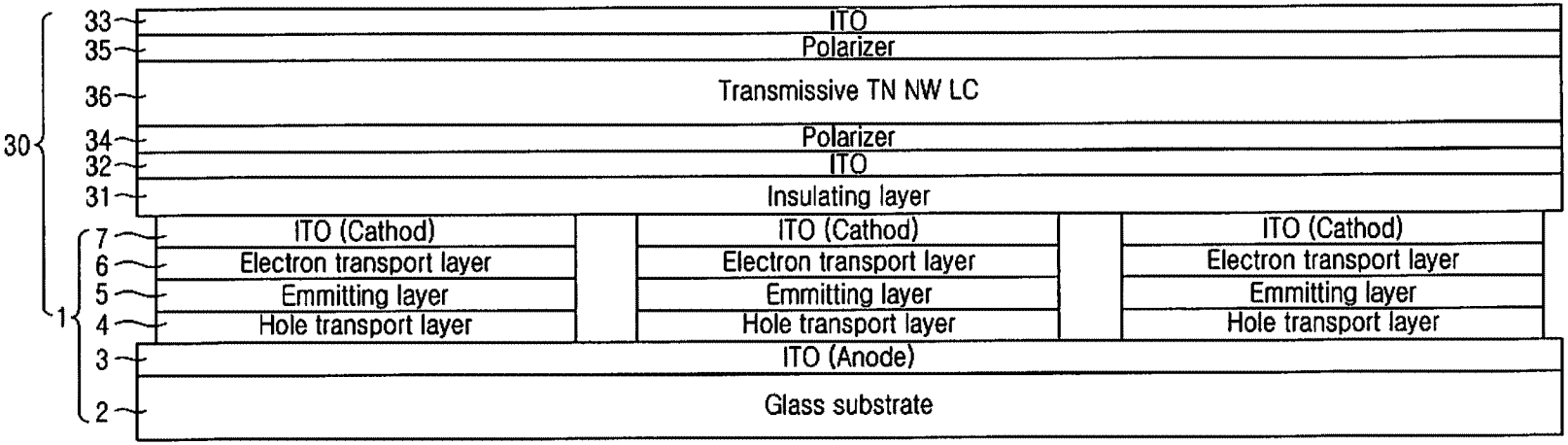
FIG. 4 is a diagram illustrating a cross section of a transparent display apparatus according to another embodiment of the present invention.

As shown in FIG. 4, a transparent display apparatus 30 includes a TOLED 1, an insulating layer 31, first and second transparent ITOs 32 and 33, first and second polarizers 34 and 35 provided between the first and the second transparent ITOs 32 and 33, and a transmissive-type LCD (for example, a transmissive TN normal white liquid-crystal) 36 provided between the first and the second polarizers 34 and 35. The TOLED 1 includes a glass substrate 2, a transparent anode 3, a hole transport layer 4, an emitting layer 5, an electron transport layer 6, and a transparent cathode 7.

A transparent display apparatus 30 having the above structure is applied to the watch-type mobile terminal 100.

As shown in FIG. 5, if the transparent display apparatus 30 is supplied with electric power, the transmissive TN NW LC 36 turns ON and is operated, thereby blocking the light of watch background images, that is, the back side second screen of the watch-type mobile terminal 100.

A phone-mode image, that is, the front side first screen 16 of the watch-type mobile terminal 100 is displayed.

A user can make a phone call through the phone-mode image of the watch-type mobile terminal 100.

As such, the transmissive-type LCD 36 is operated to function a display of the front side first screen 16 when the watch-type mobile terminal 100 is in the phone-mode, and thus the watch background of the back side second screen 17 is not shown.

As shown in FIG. 6, if the transmissive-type LCD 36 is not supplied with electric power, the transmissive-type LCD 36 remains transparent, thereby transmitting the light of watch background images, that is, the back side second screen 17 of the watch-type mobile terminal 100.

The front side first screen 16 of the watch-type mobile terminal 100 becomes transparent and the watch background of the back side second screen 17 can be shown.

Likewise, the back side watch background of the watch-type mobile terminal 100 can be displayed without the supply of electric power so that power consumption of the mobile terminal is reduced and jewel adornment of the screen is possible, and therefore luxuriant images can be presented.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A transparent display apparatus having a transparent organic light emitting diode, the transparent organic light emitting diode comprising a glass substrate, a transparent anode, a hole transport layer, an emitting layer, an electron transport layer, and a transparent cathode, the transparent display apparatus comprising:

an insulating layer stacked on the transparent cathode;

first and second transparent Indium-Tin Oxide (ITO) layers stacked on an upper part of the insulating layer to deliver electromotive force onto an entire surface of the transparent display apparatus and to transmit or block light of images according to an on/off state of a power source;

an electro chromic layer disposed between the first and the second transparent ITO layers and comprising transparent and colorless chemicals, wherein the electro chromic layer forms a color through an oxidation-reduction reaction of the chemicals according to the on/off state of the power source to absorb or block the light of images; and a substrate stacked on the second transparent ITO,

*wherein the electro chromic layer forms a black color, so as to block a light and display an image corresponding to a phone-mode on a front side of the transparent display, when the power source is on, and*

*wherein the electro chromic layer forms a transparent color, so as to transmit the light such that a user can see a watch positioned at a back side of the transparent display, when the power source is off.*

2. The transparent display apparatus as claimed in claim 1, wherein the electro chromic layer comprises transparent and colorless chemicals in a gel state, and the electro chromic layer has a sealing apparatus for sealing the gel.

3. The transparent display apparatus as claimed in claim 1, wherein the electro chromic layer forms a black color through an oxidation-reduction reaction of two kinds of chemicals, so as to block a light of background images and display a front side first screen, when the power source (0.4 to 1.6 V dc) is on, and wherein the electro chromic layer forms a transparent color, so as to absorb and transmit the light of background images and display a back side second screen, when the power source is off.

4. The transparent display apparatus as claimed in claim 3, wherein the front side first screen of the electro chromic layer is a phone-mode background of a watch-type phone, and wherein the back side second screen is a watch background of the watch-type phone.

5. The transparent display apparatus as claimed in claim 1, wherein the electro chromic layer adjusts transmittance through an intensity of the power source.

*6. A transparent display apparatus, comprising:*

*a substrate;*

*first and second transparent electrode layers stacked on the substrate to deliver electromotive force onto an entire surface of an electro chromic layer and to transmit or block light of images according to an on/off state of a power source;*

*the electro chromic layer disposed between the first and the second transparent electrode layers, wherein light transmittance of the electro chromic layer is adjusted according to whether electrical power is applied to the first and second transparent electrode layers;*

*an insulating layer stacked on an upper part of the second transparent electrode layer; and*

*a transparent organic light emitting diode layer stacked on the insulating layer,*

*wherein the electro chromic layer forms a black color, so as to block a light and display an image corresponding to a phone-mode on a front side of the transparent display, when the power source is on, and*

*wherein the electro chromic layer forms a transparent color, so as to transmit the light such that a user can see a watch positioned at a back side of the transparent display, when the power source is off.*

*7. The transparent display apparatus as claimed in claim 6, wherein the electro chromic layer forms a color to absorb or block a light according to the applied electrical power.*

* * * * *